(12) United States Patent
Ames et al.

(10) Patent No.: US 6,617,518 B2
(45) Date of Patent: Sep. 9, 2003

(54) ENHANCED FLEX CABLE

(75) Inventors: Stephen John Ames, Rochester, MN (US); Michael Joseph Connell, III, Rochester, MN (US); Eugene E. Distad, Jr., Mantorville, MN (US); Bart Owen McCoy, Rochester, MN (US); Salvatore Nicholas Storino, Rochester, MN (US)

(73) Assignee: JDS Uniphase Corporaton, San Jose, CA (US)

( * ) Notice: Subject to any disclaimer, the term of this patent is extended or adjusted under 35 U.S.C. 154(b) by 0 days.

(21) Appl. No.: 09/985,345

(22) Filed: Nov. 2, 2001

(65) Prior Publication Data

US 2003/0085054 A1 May 8, 2003

(51) Int. Cl.[7] .................................................. H05K 1/00
(52) U.S. Cl. ........................ 174/254; 174/260; 174/261; 174/262; 174/266; 361/749; 361/760
(58) Field of Search ................................ 174/254, 255, 174/260, 261, 262, 266, 52.4, 52.1, 250; 361/760, 749, 783, 807, 764, 789; 257/690, 691; 385/90

(56) References Cited

U.S. PATENT DOCUMENTS

| | | | | |
|---|---|---|---|---|
| 3,676,746 A | * | 7/1972 | Kassabgi et al. | 361/796 |
| 4,798,918 A | * | 1/1989 | Kabadi et al. | 174/36 |
| 5,224,023 A | * | 6/1993 | Smith et al. | 361/784 |
| 5,330,365 A | * | 7/1994 | Leeson | 439/77 |
| 5,516,989 A | * | 5/1996 | Uedo et al. | 174/254 |
| 5,539,848 A | * | 7/1996 | Galloway | 385/89 |
| 5,625,734 A | * | 4/1997 | Thomas et al. | 385/88 |
| 5,742,480 A | * | 4/1998 | Sawada et al. | 361/749 |
| 5,768,456 A | * | 6/1998 | Knapp et al. | 385/49 |
| 5,784,513 A | * | 7/1998 | Kuribayashi et al. | 385/88 |
| 6,203,212 B1 | * | 3/2001 | Rosenberg et al. | 385/92 |
| 6,318,909 B1 | * | 11/2001 | Giboney et al. | 385/90 |
| 6,456,720 B1 | * | 9/2002 | Brimhall et al. | 381/324 |

* cited by examiner

Primary Examiner—Kamand Cuneo
Assistant Examiner—I B Patel
(74) Attorney, Agent, or Firm—Allen, Dyer, Doppelt, Milbrath & Gilchrist, P.A.

(57) ABSTRACT

A flex cable has a number of conductive wirings for electrically coupling electrical leads of an electrical component to a wiring board. The flex cable has a conductive tab for electrically coupling one of the conductive wirings to one of the leads. The flex cable is bendable to form an essentially horizontal portion and an essentially vertical portion. The conductive tab is disposed at a transition between the horizontal portion and the vertical portion.

16 Claims, 6 Drawing Sheets

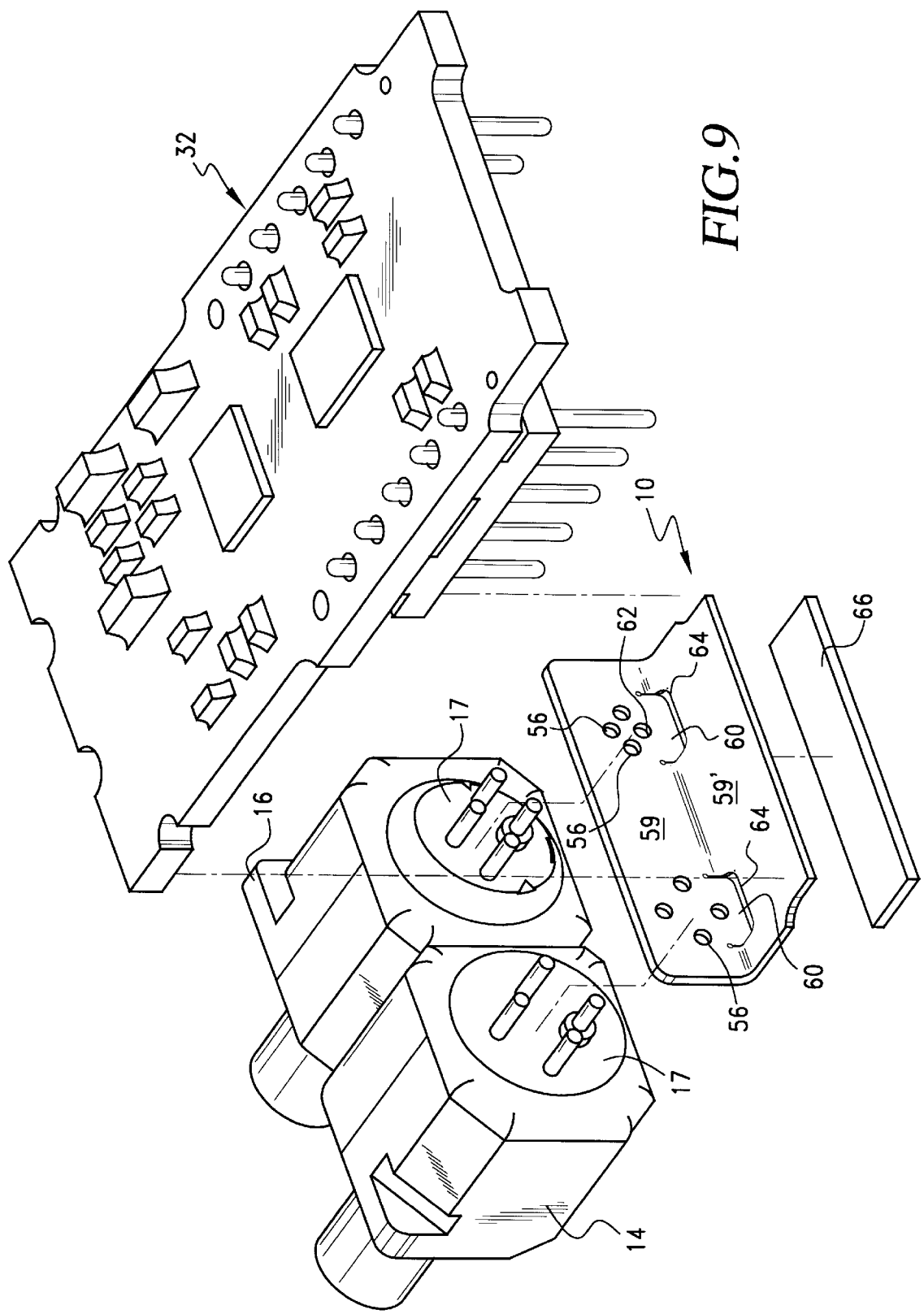

ENHANCED FLEX CABLE

BACKGROUND OF THE INVENTION

1. Field of the Invention

The present invention relates to an enhanced flex cable, used to electrically couple a fiber optic data communications transceiver, for example, to an associated wiring board.

2. Background Information

An optical transceiver is a device that uses pulses of light to carry signals for transmitting and receiving data at very high speeds. Typically, the light pulses are converted into, or converted from, associated electrical signals using known circuitry. Such optical transceivers are often used in devices, such as computers and data communication networks, in which data must be transmitted at high rates of speed.

Optical transceivers typically use an optical transmitter, such as a light emitting diode (LED) or laser, for example, to transmit the light pulses, and/or an optical receiver, such as a photodiode chip or photo detector chip (hereinafter receiver chip), for example, to receive the light pulses. One type of optical transceiver has a subassembly including a receiver chip disposed within a transistor-outline (TO) can package. This type of optical transceiver subassembly is known as a receiver optical subassembly (hereinafter ROSA for short). Another type of optical transceiver has a subassembly that includes either an edge-emitting laser or a surface-emitting laser, such as a VCSEL, disposed within a TO can package. This type of subassembly is known as a transmitter optical subassembly (hereinafter TOSA for short). The specifics of ROSAs and TOSAs are well known to those skilled in the art. However, briefly, the TO can package is a metal housing that hermetically houses the other components of the ROSA or TOSA. The TO can package may then be disposed within a further housing, formed of a plastic for example, that is adapted to couple a ferrule or optical fiber to the receiver chip or laser.

Typically, the ROSA and TOSA are electrically coupled to a printed circuit board (also known as, and herein after referred to, as a transceiver wiring board). The transceiver wiring board includes the associated electronics for operating the receiver chip or laser. These electronics include, for example, the laser driver and control, receiver preamplifier and post amplifier, and other supporting components. In a computer system, the transceiver wiring board is typically connected to a further circuit board, for example, a motherboard. The assembly may then be positioned within a chassis, which is a frame fixed within a computer housing. The chassis serves to hold the assembly within the computer housing.

Typically, the TOSA and ROSA are electrically coupled to the transceiver wiring board using a number of relatively rigid leads. For example, the aforementioned ROSA conventionally has four leads: a power lead for supplying power to the ROSA; a single ground lead for connecting the ROSA to a ground potential; and two data leads for transmitting signals to and/or from the ROSA. The TOSA also conventionally has a number of leads for coupling the laser within the TO can to the transceiver wiring board. Each of the respective leads typically extends out of the TO can for connection to the transceiver wiring board in a known manner, and in an industry standard arrangement. For example, the ends of the respective leads may be passed into corresponding vias formed in the transceiver wiring board, and soldered in place. Alternatively, the ROSA/TOSA leads may be connected to the transceiver wiring board by soldering the leads to electrical pads on the bottom or top surface of the transceiver wiring board.

However, this manner of connecting the leads to the transceiver wiring board requires that each of the leads has a relatively long length. The long lengths have generally been deemed necessary in order to allow the ROSA/TOSA to be properly oriented relative to the transceiver wiring board, while still allowing the ROSA/TOSA to be connected thereto. That is, the leads typically extend out of a rear portion of the ROSA/TOSA and initially in a direction parallel to the surface of the transceiver wiring board. Thus, in order to connect the leads to the transceiver wiring board, the leads must also extend for a distance in a different direction, i.e., toward the transceiver wiring board. Depending on the orientation and geometry, the length of the leads may be so long as to cause the leads to disadvantageously have a relatively high impedance. As is known to those skilled in the art, a high impedance on the leads is undesirable, since this may affect the immunity of the receiver, for example, to noise present on the power supply or ground. Moreover, this configuration may subject the leads to a cross talk (i.e., undesirable coupling) effect. Thus, there is need for a way to easily and rapidly electrically couple the leads of a ROSA and/or TOSA, for example, to a transceiver wiring board, while reducing the impedance, and minimizing the cross talk effect. Furthermore, due to the industry-standard arrangement of the optical transceiver utilizing a ROSA and/or TOSA, the ROSA and/or TOSA are typically placed immediately adjacent to an edge face of the transceiver wiring board, with the ground lead typically extending from the TO can at the edge face (i.e., between the upper and lower primary surfaces of the transceiver wiring board). The transceiver wiring board is thus conventionally provided with a notch to accommodate the ground lead. However, this requires that the ground lead be provided with a relatively long length and numerous bends to allow the ground lead to pass past the notch and to allow the ground lead to be connected to the transceiver wiring board in the aforementioned manner. Alternatively, it is also known to provide a ground cage that can be connected to the ground lead and to a ground potential. For example, the ground cage can be attached and grounded to the transceiver wiring board, which may in turn be fastened to, and grounded in a known manner, to the motherboard and its ground. While this may allow the length of the ground lead to be reduced, it also requires the use of a further component (i.e., the ground cage), which increases inventory costs. Moreover, connecting the ground cage to the ground lead and to the transceiver wiring board is a labor intensive procedure.

SUMMARY OF THE INVENTION

According to one aspect of the invention, a flex cable is used in conjunction with a so-called duplex optical transceiver. The duplex optical transceiver has a so-called electro-optic receiver optical subassembly (ROSA) positioned adjacent to a transmitter optical subassembly (TOSA). In the exemplary embodiment, the ROSA has four leads projecting from the rear surface of a respective transistor-outline (TO) can package: a power lead for supplying power to the ROSA; a ground lead for connecting the ROSA to a ground potential; and two data leads for transmitting signals to and/or from the ROSA. The TOSA may be similarly tailored, or have a different configuration. However, in the exemplary embodiment, the TOSA has three leads projecting from the rear surface of a respective TO can package: a power lead for supplying power to the TOSA; a cathode lead; and a monitor lead. However, the present invention may be used with electrical components having more or fewer leads without departing from the spirit and scope of the invention.

The exemplary flex cable is used to electrically couple the leads of the ROSA and TOSA to a transceiver wiring board. The transceiver wiring board includes the associated electronics for operating the ROSA and/or TOSA, for example the laser driver and control, receiver preamplifier and post amplifier, and other supporting components.

In accordance with industry standards, the ROSA/TOSA are placed immediately adjacent to an edge face of the transceiver wiring board. Moreover, due to industry standards, the ground lead of the ROSA, for example, extends from the TO can package in a region of the edge face of the wiring board (i.e., between the upper and lower primary surfaces of the transceiver wiring board). To accommodate the ground lead, the edge face of the transceiver wiring board is provided with a notch. Thus, the ground lead projects into the space formed by the notch.

The leads of the ROSA and TOSA are advantageously electrically coupled to a transceiver wiring board using the flex cable. In the exemplary embodiment, the flex cable has a relatively flat configuration, and is relatively flexible to allow the flex cable to be bent at an angle. The term "flexible" means that the cable can be bent into a desired shape.

In the exemplary embodiment, the flex cable has two superposed conductive layers, such as copper layers, separated from each other by an insulating layer, such as a polyamide material.

In this exemplary aspect of the invention, the conductive layers are patterned, in a known manner, so that one of the conductive layers includes a ground layer which will serve to couple the ground lead of the ROSA, for example, to the ground potential.

The exemplary flex cable has the outer surfaces of the respective conductive layers coated with an insulating material, such as a polyamide film, to ensure that the conductive layers do not inadvertently become shorted.

One end of the flex cable is attached to the ROSA/TOSA, so that the respective leads are electrically coupled to the respective conductive wirings of the flex cable. In the illustrated exemplary embodiment, the respective leads are severed, to form relatively short stumps. As such, the disadvantages associated with long, exposed leads are eliminated. Moreover, the flex cable may have a plurality of holes formed therein, for receiving the respective lead stumps. In this aspect of the invention, the holes are formed in predefined locations to provide access to the respective conductive wirings. Thus, when the lead stumps are inserted into the respective holes, the respective conductive wirings can be electrically connected, for example using soldering techniques, to the respective leads.

In this exemplary aspect of the invention, the holes may be plated with a conductive material. The conductive material is in contact with the respective wiring accessible by way of the hole, and serves as an interface between the respective lead and the conductive wiring.

The opposite end of the flex cable may have portions of the insulating material removed, to expose portions of the respective conductive wirings. These exposed portions can then be coupled, for example wire bonded, to the respective signal, ground and/or power traces on the upper surface of the transceiver wiring board. Thereafter, the various electrical connections can be coated to protect the connections and wirings from being damaged.

In an exemplary aspect of the invention, the flex cable is bent at an angle, for example a 90 degree angle. This bend allows the flex cable to advantageously follow the transition between the back of the TO can, where the leads are located, and the surface of the transceiver wiring board. Thus, the flex cable replaces the extra length of the conventional leads that was previously needed to form the connection.

In an alternative exemplary aspect of the invention, the flex cable may be configured to allow it to be connected to an underside of the transceiver wiring board. For example, the flex cable may be bent at a 90-degree angle, so that a vertical portion of the flex cable can be attached to the leads of the ROSA/TOSA, and the horizontal portion of the flex cable can be attached to the underside of the transceiver wiring board. This aspect of the invention frees up the upper surface of the transceiver wiring board for the placement of electronic components, and/or to allow for the further miniaturization of the wiring board. Moreover, this aspect of the invention may facilitate assembly of the arrangement, especially when the upper surface of the transceiver wiring board has other features disposed thereon, which may prevent the attachment of the flex cable to the upper surface.

In all aspects of the invention, the surface of the transceiver wiring board may be provided with contact pads in electrical communication with the respective signal, ground and/or power traces. The exposed portions can be directly connected to the respective contact pads, to allow the wirings of the flex cable to be electrically coupled to the respective signal, ground and/or power traces of the transceiver wiring board.

In another exemplary aspect of the invention, the flex cable is provided with a grounding tab that is electrically coupled to the ground layer, and which is adapted to be connected to the ground lead. For example, the grounding tab can simply be a flap that is punched from or cut into the flex cable. The ground tab, in this exemplary aspect of the invention, has a portion of the ground layer therein, and has a hole that accommodates the ground lead to allow for communication with the ground wiring, similar to the holes discussed above. Thus, when the flex cable is attached to the upper surface of the transceiver wiring board, the grounding tab can be used to project into the notch of the transceiver wiring board, and coupled with the ground lead. To facilitate this coupling, the interface (i.e., point of connection) between the grounding tab and the remaining portion of the flex cable is disposed at a junction where the flex cable is to be bent at an angle to accommodate the transition between the vertical surface of the TO can package and the upper surface of the transceiver wiring board. Thus, when the flex cable is bent to allow its connection to both the upper surface of the transceiver wiring board and the leads of the ROSA/TOSA, the grounding tab will be disposed in a vertical direction, allowing its direct connection to the ground lead. Moreover, this will also cause a flap opening to form in the flex cable, which is disposed at least partially in the radius of the bend of the flex cable. The flap opening will allow access to the ground lead from a direction of the upper surface, so that the ground lead can be soldered, for example, to the grounding tab.

Likewise, when the flex cable is attached to the lower surface of the transceiver wiring board, the flap opening will allow access to the ground lead from a direction of the lower surface, so that the ground lead can be soldered, for example, to the grounding tab. This is especially advantageous when the upper surface of the transceiver wiring board has features that may prevent access to the lead from the direction of the upper surface, and when the flex cable is pre-attached to the lower surface. Moreover, the grounding tab can be tailored to lay flush against the back of the TO can in a region of the ground lead, even if the flex cable is curved in this region. Thus, this configuration prevents stress in the flex cable, and in the respective electrical connections between the leads and the flex cable.

In an alternative aspect of the invention, the grounding tab may be a separately formed feature that is attached to the underside of the flex cable, for example, and electrically coupled to the ground layer. Similar to the previously described embodiment, this aspect of the invention has the grounding tab disposed at the junction where the flex cable is to be bent at an angle. A separate through hole may then be formed in the flex cable to provide access to the ground lead, in a manner to the flap opening, as discussed above.

The flap opening formed in the flex cable also helps to allow the flex cable to be bent into its desired shaped. By forming the grounding tab at the junction where the flex cable is to be bent, the workability of the flex cable is enhanced. Moreover, in another aspect of the invention, it is also contemplated that the grounding tab be provided solely to enhance the bendability of the flex cable. In this aspect of the invention, the tab (if provided) is not necessarily electrically connected to the wirings of the flex cable. Moreover, it is further contemplated that instead of a tab, through holes may be formed in the flex cable to enhance its flexability.

Moreover, it is contemplated that a conductive tab tailored in the manner of the above-described grounding tab could be electrically coupled to other conductive layers or wires of the flex cable, such as the signal layer or wires, or the power layer or wires, for connection to other respective leads, for example.

In another aspect of the invention, a stiffener plate may be disposed adjacent to an end of the flex cable that is connected to the transceiver wiring board. The stiffener plate provides support for the flex cable, to help ensure the connection between the flex cable and the transceiver wiring board is maintained. Moreover, if the stiffener plate is formed of a heat conductive material, such as aluminum, heat generated from an external source may be intentionally conducted via the plate into the interface between the flex cable and the transceiver wiring board. This heat can be used to cause solder located at the interface to reflow, to help form the electrical connection.

BRIEF DESCRIPTION OF THE DRAWINGS

FIG. 9 is yet a further perspective, exploded view of the present invention, illustrating another exemplary aspect of the flex cable in conjunction with an optical transceiver assembly.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, in the application, and if used, the terms "upper", "lower", "front", "back", "over", "under", "vertical", "horizontal", and similar such terms are not to be construed as limiting the invention to a particular orientation. Instead, these terms are used only on a relative basis.

Figure 1:
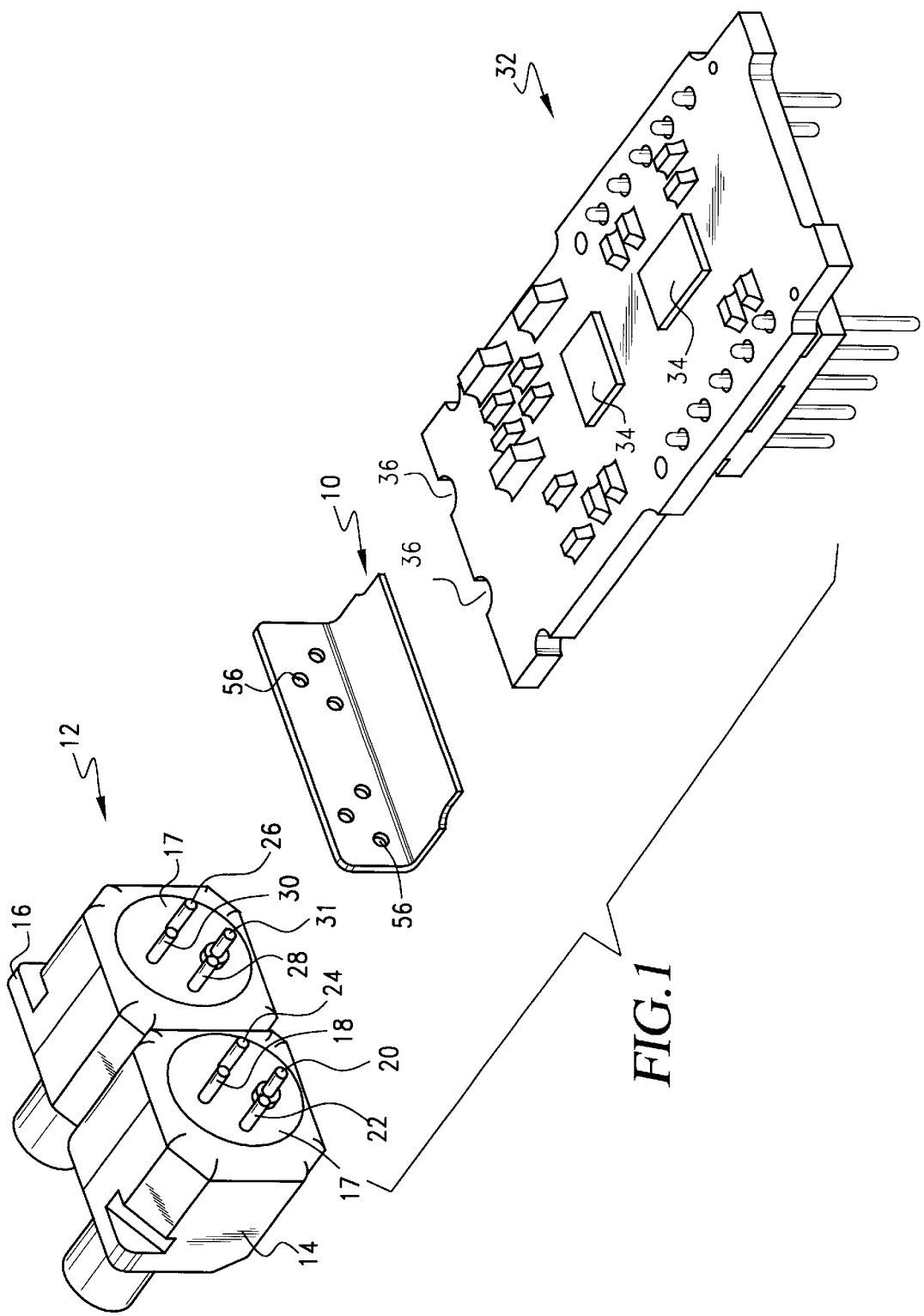
FIG. 1 is a perspective, exploded view of an exemplary aspect of the present invention, illustrating a flex cable in conjunction with an optical transceiver assembly.
Figure 2:
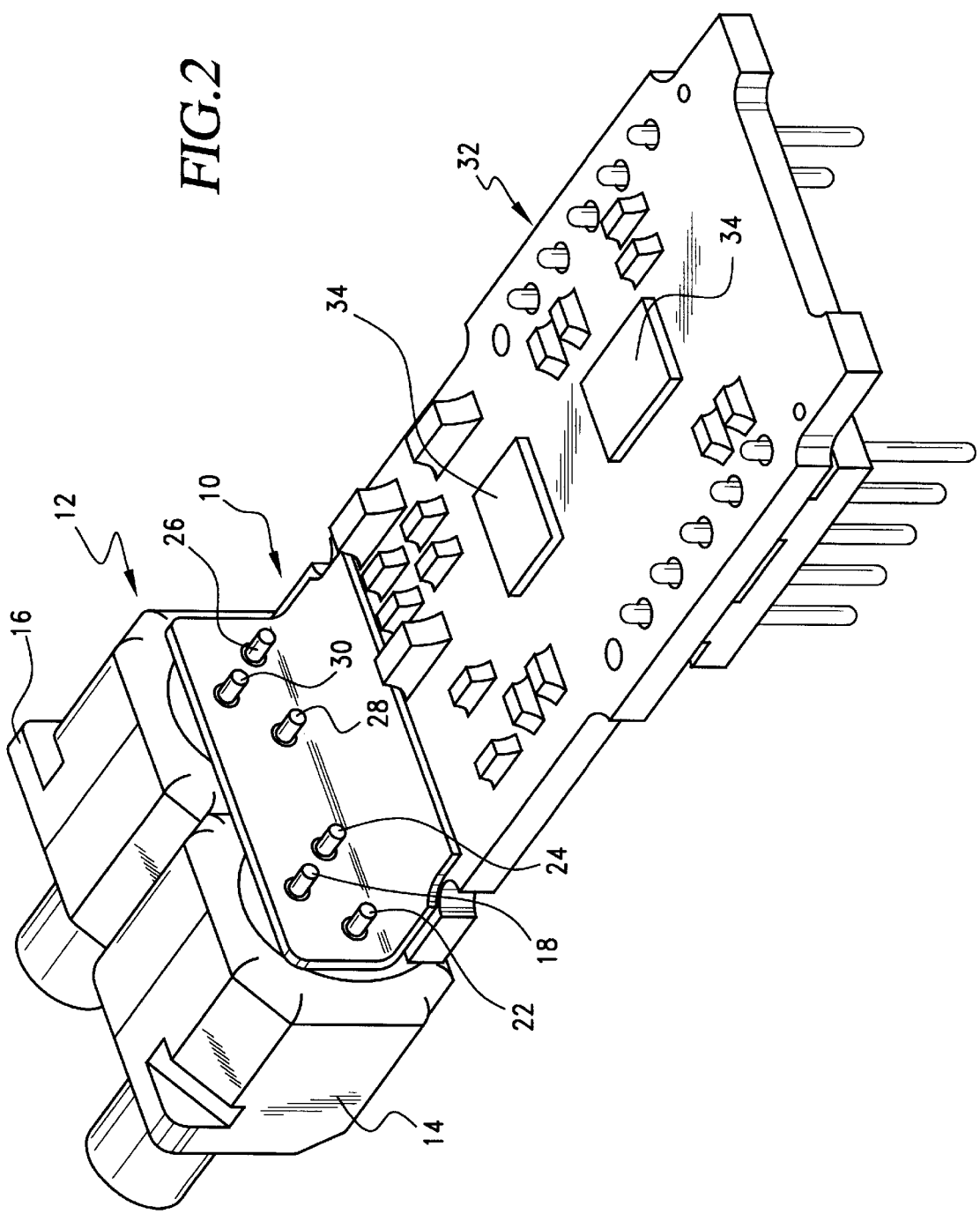
FIG. 2 is a perspective, assembled view of the arrangement shown in FIG. 1.

Referring to FIGS. 1 and 2, an exemplary flex cable 10 is illustrated in conjunction with a duplex optical transceiver 12, in which a so-called electro-optic receiver optical subassembly 14 (hereinafter ROSA for short) is positioned next to a transmitter optical subassembly 16 (hereinafter TOSA for short). However, the present invention is equally applicable to optical transceivers having only a ROSA or TOSA, or to optical transceivers having multiple ROSAs and/or TOSAs. Alternatively, the flex cable according to the present invention may be used whenever a difficult-to-access lead is to be electrically coupled to another feature or component.

In the exemplary illustrated embodiment, the ROSA 14 has four leads projecting from the rear surface of a respective transistor-outline (TO) can package 17: a power lead 18 for supplying power to the ROSA; a ground lead 20 for connecting the ROSA to a ground potential; and two data leads 22, 24 for transmitting signals to and/or from the ROSA. The TOSA 16 may be similarly tailored, or have a different configuration. However, in the illustrated exemplary embodiment, the TOSA has four leads projecting from the rear surface of a respective TO can package: a power lead 26 for supplying power to the TOSA; a cathode lead 28; a monitor lead 30; and a ground lead 31. However, the present invention may be used with electrical components having more or fewer leads without departing from the spirit and scope of the invention.

The exemplary flex cable 10 is used to electrically couple the leads of the ROSA and TOSA to a transceiver wiring board 32. The transceiver wiring board 32 includes the associated electronics 34 for operating the ROSA and/or TOSA, for example the laser driver and control, receiver preamplifier and post amplifier, and other supporting components.

As shown, the ROSA/TOSA are placed immediately adjacent to an edge face of the transceiver wiring board 32. Moreover, due to industry standards, the ground lead 20 of the ROSA 14, and the ground lead 31 of the TOSA 16, for example, extend from the TO can package 17 in a region of the edge face of the wiring board (i.e., between the upper and lower primary surfaces of the transceiver wiring board). To accommodate the ground leads, the edge face of the transceiver wiring board is provided with notches 36. Thus, the ground leads 20, 31 project into the spaces formed by the notches 36.

In the exemplary illustrated embodiment, the flex cable 10 has a relatively flat configuration, and is relatively flexible to allow the flex cable to be bent at an angle. The term "flexible" means that the cable 10 can be bent into a desired shape.

Figure 3:
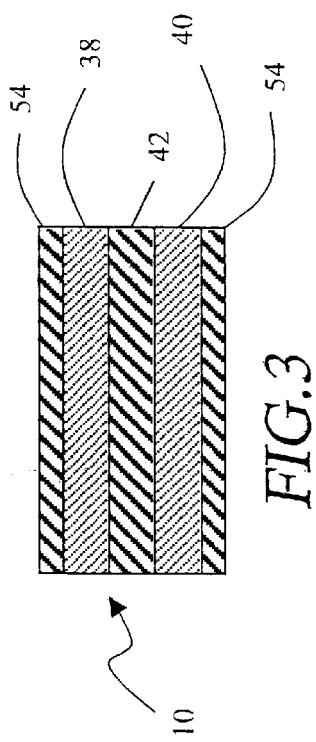
FIG. 3 is a partial cross-sectional view of the flex cable shown in FIG. 1.
Figure 4:
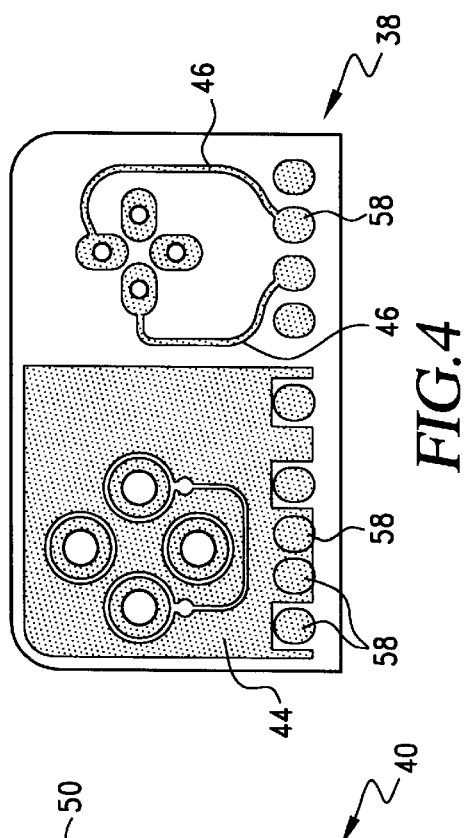
FIGS. 4–7 are elevational views of the various layers of the flex cable shown in FIG. 1.
Figure 5:
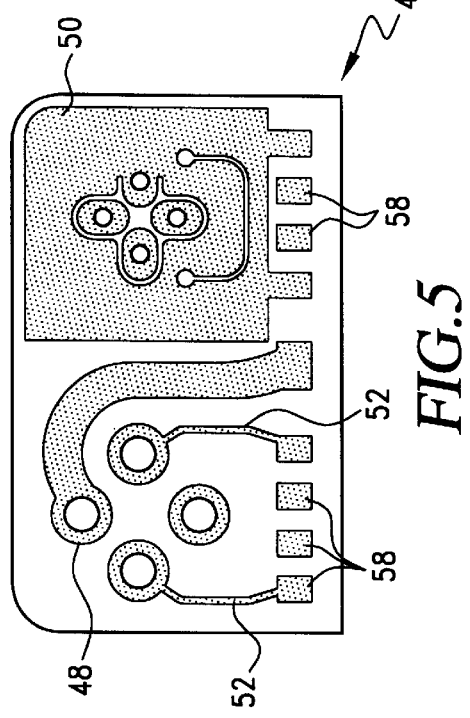
Figure 7:
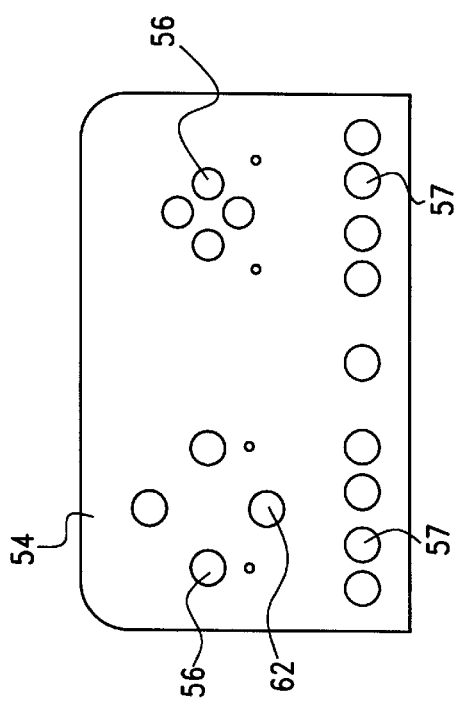
Figure 6:
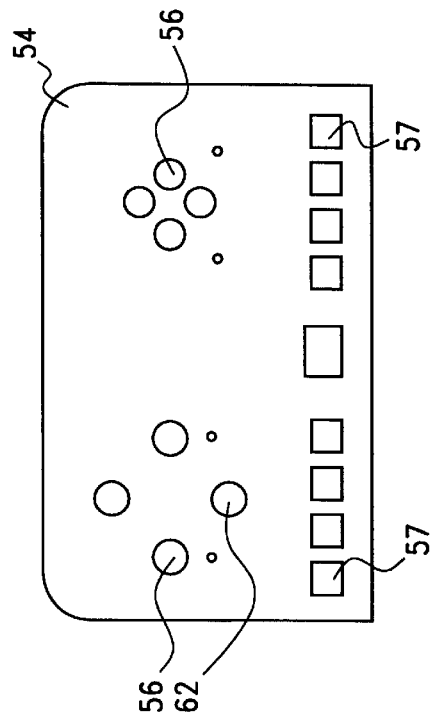

Further, and referring also to FIG. 3, in the exemplary illustrated embodiment, the flex cable 10 has two superposed conductive layers 38, 40, such as copper layers, separated from each other by an insulating layer 42, such as a polyamide material. Of course, the flex cable 10 may have a different number of conductive layers without departing from the spirit and scope of the present invention.

Referring also to FIGS. 4–7, in this exemplary aspect of the invention, the conductive layers 38, 40 are patterned, in a known manner, so that one of the conductive layers 38 includes a ground layer 44 which will serve to couple the ground lead 20 of the ROSA 14, for example, to the ground potential. This conductive layer 38 may also include signal traces 46 for coupling the monitor lead 30 and the cathode lead 28 of the TOSA 16 to associated circuitry on the transceiver wiring board 32. The other conductive layer 40 may include a power trace 48 for coupling the power lead 18 of the ROSA 14 to a power source; a power layer 50 for coupling the power lead 26 of the TOSA 16 to a power source; and signal traces 52 for coupling the data leads 22, 24 of the ROSA to associated circuitry on the transceiver wiring board. Of course, this configuration is purely exemplary, and the conductive layers 38, 40 may have a multitude of other configurations, depending on the system needs. For simplicity, the conductive traces and conductive layers of the flex cable will hereinafter be referred to as conductive wirings.

The exemplary illustrated flex cable 10 has the outer surfaces of the respective conductive layers 38, 40 coated with an insulating material 54, such as a polyamide film. This material helps to ensure that the conductive layers do not inadvertently become shorted.

One end of the flex cable 10 is attached to the ROSA/TOSA, so that the respective leads 18–31 are electrically coupled to the respective conductive wirings 44–52 of the flex cable. To facilitate this coupling, the respective leads 18–31 may be tailored as short stumps. Moreover, the flex cable 10 may have a plurality of holes 56 formed therein, for receiving the respective lead stumps. In this aspect of the invention, the holes 56 are formed in predefined locations to provide access to the respective conductive wirings 44–52. Thus, when the lead stumps are inserted into the respective holes 56, the respective conductive wirings 44–52 can be electrically connected, for example using soldering techniques, to the respective leads 18–31.

In an exemplary aspect of the invention, the holes 56 may be plated with a conductive material. The conductive material would be in contact with the respective conductive wirings 44–52 by way of the holes, and would serve as an interface between the respective leads and the conductive wirings. However, it is also contemplated that the holes 56 may be filled with a conductive material, and pads formed on the filled holes. In this aspect of the invention (not shown), the leads 18–31 would be electrically connected to the respective pads, to electrically connect the respective leads to the conductive wirings 44–52.

The opposite end of the flex cable 10 may have windows 57 formed in the insulating material 54, to expose portions 58 of the respective conductive wirings 44–52. These exposed portions 58 can then be coupled, for example wire bonded, to respective signal, ground and/or power traces (not shown) on the surface of the transceiver wiring board 32. Thereafter, the various electrical connections can be coated to protect the connections and wirings from being damaged. For example, the coating can be a so-called chip coat epoxy material.

Figure 10:
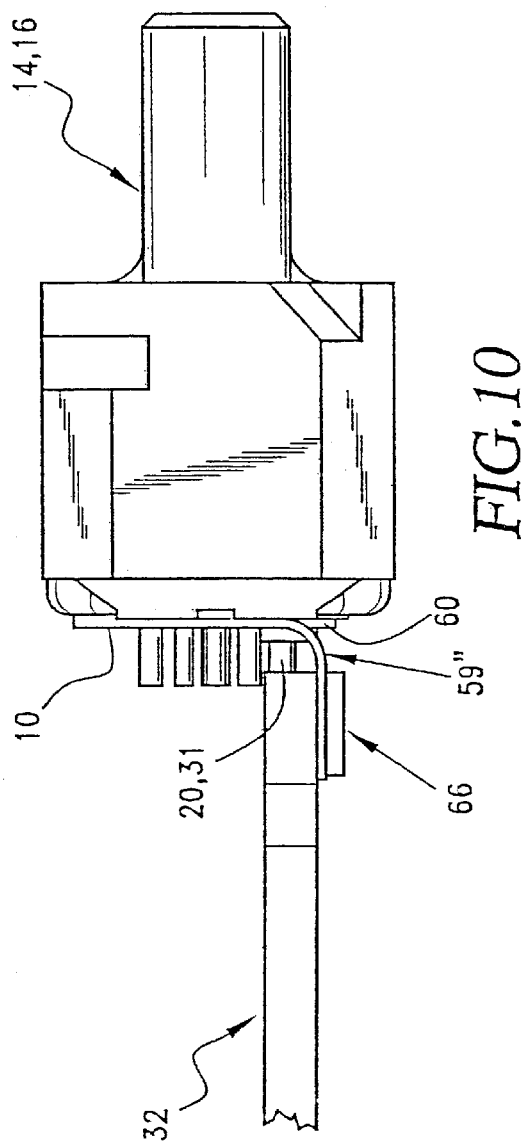
FIG. 10 is a side, assembled view of the arrangement shown in FIG. 9.
Figure 8:
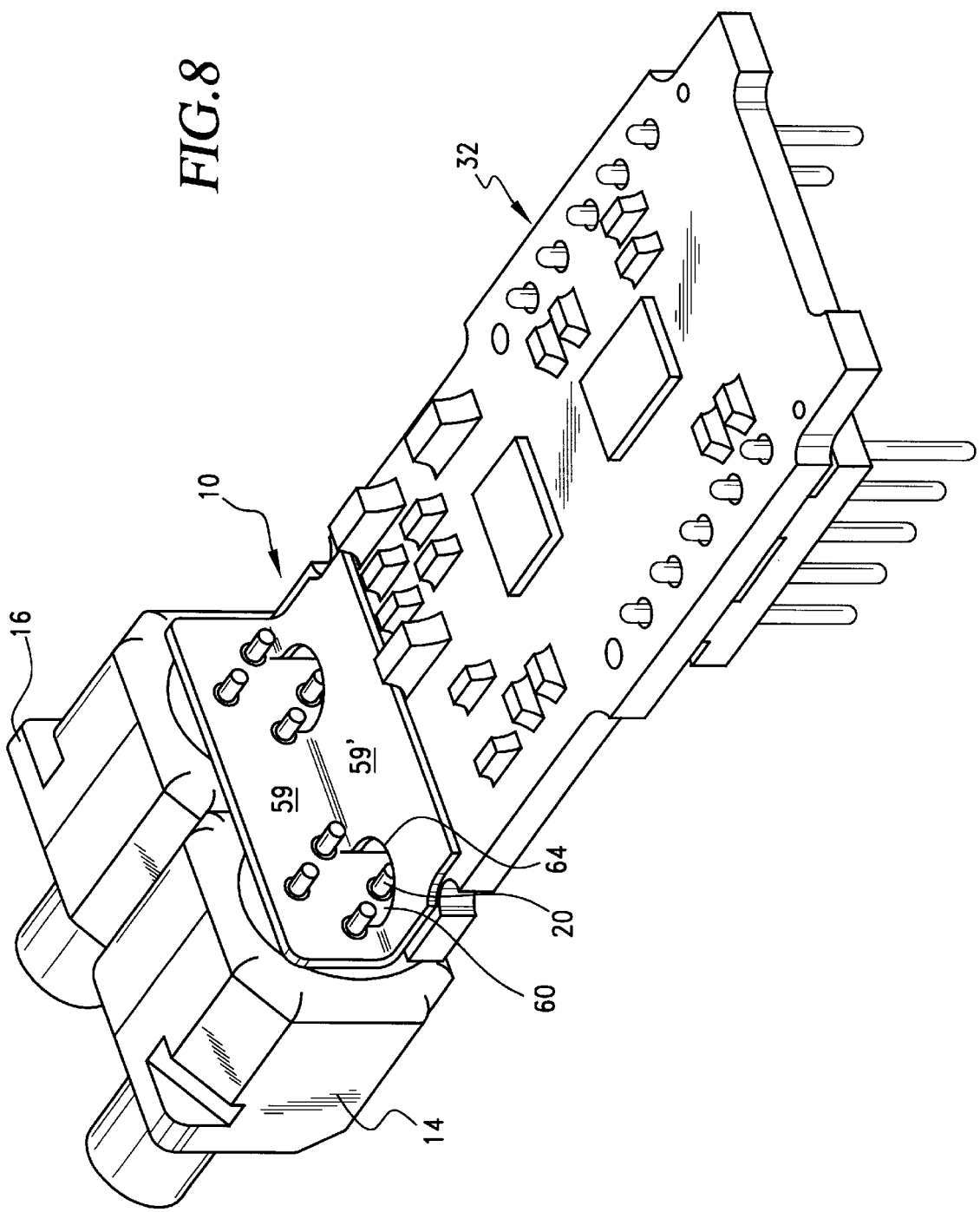
FIG. 8 is a perspective view of the present invention, illustrating another exemplary aspect of the flex cable in conjunction with an optical transceiver assembly.

Referring also to FIGS. 8–10, the flex cable 10 may be configured to allow it to be connected to either an upper surface of the transceiver wiring board, as shown in FIG. 8, or to an underside of the transceiver wiring board, as shown in FIGS. 9 and 10. For example, the flex cable 10 may be bent at a 90 degree angle, so that a vertical portion 59 of the flex cable can be attached to the leads 18–31 of the ROSA/TOSA, and the horizontal portion 59' of the flex cable can be attached to the upper or lower surface of the transceiver wiring board. Alternatively, the flex cable may have one or more lateral ears (not shown), which include the exposed portions 58. The ears can be bent around the lateral sides of the transceiver wiring board, for connection to the respective signal, ground and/or power traces on the upper or lower surface of the transceiver wiring board. When the flex cable 10 is connected to the lower surface of the transceiver wiring board, the upper surface of the transceiver wiring board is freed up for the placement of electronic components, and/or to allow for the further miniaturization of the wiring board. Moreover, this configuration may facilitate assembly of the arrangement, especially when the upper surface of the transceiver wiring board has other features disposed thereon, which may prevent the attachment of the flex cable to the upper surface. However, attaching the flex cable to the upper surface may be advantageous in simplifying the wiring design of the wiring board.

It is also contemplated that the flex cable 10 may be pre-attached to the transceiver wiring board 32, to facilitate the assembly of the ROSA/TOSA arrangement. Alternatively, the flex cable 10 may be first attached to the leads of the ROSA/TOSA, and subsequently attached to the transceiver wiring board.

Referring briefly back to FIG. 2, when the ground leads 20, 31 are disposed within the notches 36 formed in the transceiver wiring board 32, and when the flex cable 10 is connected to an upper surface of the transceiver wiring board, the flex cable, without further modifications being made thereto, will cover and hide the ground leads. Thus, the flex cable, as previously defined, can not be easily electrically connected to the ground leads 20, 31, since the ground leads will be disposed below the level of the upper surface of the transceiver wiring board.

Moreover, as can be best appreciated from FIG. 10, when the flex cable 10 is attached to a lower surface of the transceiver wiring board 32, the flex cable will be in front of the ground leads 20, 31, at a location above the transition 59" between the horizontal 59' and vertical portions 59. Although it may be possible to access the ground leads through the notches 36 and from a direction of the upper surface of the transceiver wiring board, if there are other features disposed on the upper surface, these other features may prevent access to the ground leads to prevent their connection to the flex cable.

Moreover, access to the ground leads 20, 31 from a direction of the lower surface may be prevented due to the horizontal portion 59' of the flex cable 10 covering access to the notches 36, especially if the flex cable is attached to the transceiver wiring board 32 prior to its attachment to the leads of the ROSA/TOSA. Additionally, the transition 59" of the flex cable 10 from the vertical direction to the horizontal direction is not immediate. Instead, the transition 59" is curvilinear, so that a relatively large radius is formed at the transition. This radius extends into a region of the flex cable where the holes for accommodating the ground leads 20, 31 are disposed. This radius will prevent the flex cable 10 from being flush against the horizontal surface of the TO can package 17 in a region of the ground leads 20, 31. Thus, the solder connection between the ground leads 20, 31 and the flex cable will be located in a curvilinear portion of the flex cable, and will not have the back support of the TO can package 17, thus subjecting the connection to stress and possible breakage. Alternatively, if the flex cable 10 is forced flush against the TO can package 17 in a region of the ground leads 20, 31, the flex cable will be subjected to stresses that may cause the flex cable, or the respective electrical connections between the leads and the flex cable, to fracture and break.

Thus, in another exemplary aspect of the invention, the flex cable 10 is provided with a grounding tab 60 that is electrically coupled to the ground layer 44, and which is adapted to be connected to the ground lead 20. Another grounding tab can be provided for ground lead 31. For example, the grounding tab 60 can simply be a flap that is punched from or cut into the flex cable 10. The grounding tab 60, in this exemplary aspect of the invention, has a portion of the ground layer 44 therein, and has a hole 62 that allows for communication with the ground layer, similar to the holes 56 discussed above. Thus, when the flex cable 10 is attached to the upper surface of the transceiver wiring board 32, as shown in FIG. 8, the grounding tab 60 can be used to project into the notch 36 of the transceiver wiring board, and coupled with the ground lead 20. To facilitate this coupling, the interface (i.e., point of connection) between the grounding tab 60 and the remaining portion of the flex cable 10 is disposed at a junction where the flex cable is to be bent at an angle to accommodate the transition between the vertical surface of the TO can package 17 and the upper surface of the transceiver wiring board 32. Thus, when the flex cable 10 is bent to allow its connection to both the upper surface of the transceiver wiring board 32 and the leads of the ROSA/TOSA, the grounding tab 60 will be disposed in a vertical direction, allowing its direct connection to the ground lead 20. Moreover, this will also cause a flap opening 64 to form in the flex cable 10, which is disposed at least partially in the radius of the bend of the flex cable 10. The flap opening 64 will allow access to the ground lead 20 from a direction of the upper surface, so that the ground lead can be soldered, for example, to the grounding tab 60.

Likewise, when the flex cable 10 is attached to the lower surface of the transceiver wiring board 32, as shown in FIGS. 9 and 10, the flap opening 64 will allow access to the ground lead 20 from a direction of the lower surface, so that the ground lead can be soldered, for example, to the grounding tab 60. This is especially advantageous when the upper surface of the transceiver wiring board 32 has features that may prevent access to the lead 20 from the direction of the upper surface, and when the flex cable is pre-attached to the lower surface. Moreover, the grounding tab 60 can be tailored to lay flush against the back of the TO can package 17 in a region of the ground lead 20, even if the flex cable is curved in this region. Thus, this configuration prevents stress in the flex cable, and in the respective electrical connections between the leads and the flex cable.

In an alternative aspect of the invention, the grounding tab 60 may be a separately formed feature (not shown) that is attached to the underside of the flex cable 10, for example, and electrically coupled to the ground layer 44. Similar to the previously described embodiment, this aspect of the invention has the grounding tab 60 disposed at the junction where the flex cable 10 is to be bent at an angle. A separate through hole (not shown) may then be formed in the flex cable to provide access to the ground lead, in a manner similar to the flap opening 64, as discussed above.

The flap opening 64 formed in the flex cable 10 also helps to allow the flex cable to be bent into its desired shape. That is, the flex cable 10 is relatively stiff, and without the formation of the flap openings 64, the flex cable may be difficult to bend. By forming the grounding tab 60 at the junction where the flex cable is to be bent, the workability of the flex cable is enhanced. Moreover, in another aspect of the invention, it is also contemplated that the tab 60 be provided solely to enhance the bendability of the flex cable 10. In this aspect of the invention, the tab is not necessarily electrically connected to the conductive wirings of the flex cable. Moreover, it is further contemplated that instead of a tab, through holes may be formed in the flex cable to enhance its flexibility.

Moreover, it is contemplated that a conductive tab tailored in the manner of the above-described grounding tab 60 could be electrically coupled to other conductive layers or wires of the flex cable, such as the signal layer or wires, or the power layer or wires, for connection to other respective leads, for example.

In another aspect of the invention, a stiffener plate 66 may be disposed adjacent to an end of the flex cable 10 that is connected to the transceiver wiring board 32. The stiffener plate 66 provides support for the flex cable, to help ensure the connection between the flex cable and the transceiver wiring board is maintained. Moreover, if the stiffener plate 66 is formed of a heat conductive material, such as aluminum, heat generated from an external source may be intentionally conducted via the plate into the interface between the flex cable and the transceiver wiring board. This heat can be used to cause solder located at the interface to reflow, to help form the electrical connection.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes, and adaptations, and the same are intended to be comprehended within the meaning and range of equivalents of the appended claims.

What is claimed is:

1. A flex cable, comprising:
    a conductive wiring, bent to form an angled shape, defining first and second substantially perpendicular regions with a bend region therebetween; and
    a conductive tab electrically coupled to said conductive wiring extending from the bend region coplanar with the first region; and,
    a through opening in the second region providing access to the conductive tab.

2. The flex cable recited in claim 1, wherein said conductive wiring is a ground wiring, said conductive tab being electrically coupled to said ground wiring.

3. The flex cable recited in claim 1, further comprising a first and a second superposed conductive layer, said first conductive layer being comprised of said conductive wiring, and said second conductive layer being comprised of further conductive wirings; and an insulating layer disposed between said first and second conductive layers.

4. The flex cable recited in claim 3, further comprising an insulating coating covering said first and said second conductive layers, said insulating coating having at least one window formed therein to expose a portion of at least one of said conductive wirings, to allow the exposed portion to be electrically coupled to a wiring board.

5. The flex cable recited in claim 4, wherein at least one through hole is disposed in said flex cable that passes through said at least one of said conductive wirings, the at least one through hole being adapted to receive a lead of an electrical component therein.

6. The flex cable recited in claim 5, wherein said at least one through hole is disposed in said conductive tab.

7. The flex cable recited in claim 6, wherein said conductive wirings include a ground wiring, said conductive tab having at least a portion of said ground wiring formed therein, said at least one through hole passing through said portion of said ground wiring.

8. The flex cable recited in claim 5, wherein said at least one through hole is plated with a conductive material that is in electrical communication with said at least one of said conductive wirings.

9. The flex cable recited in claim 1, wherein said conductive tab is a flap from said second region, and wherein the through opening is formed through said second region by said conductive tab projecting in the direction away from said conductive wiring when said conductive wiring is bent.

10. An electro-optical device comprising:
   an optical sub-assembly for converting optical signals into electrical signals or for converting electrical signals into optical signals, the optical sub-assembly including electrical leads extending from a rear end thereof;
   a wiring board including electronic circuitry for operating the optical sub-assembly; and
   a flex cable comprising:
      a first region extending parallel to the rear end of the optical sub-assembly above an upper surface of the wiring board;
      a second region extending parallel to the upper surface of the wiring board and perpendicular to the first region;
      a bend region between the first and second regions;
      a tab coplanar with the first region extending outwardly from proximate the bend region for electrical connection with one of the leads from the optical sub-assembly that extends below the upper surface of the wiring board; and
      a through opening proximate the bend region for accessing the electrical lead electrically connected by the tab;
   wherein conductive wiring extends from the first region to the second regions for electrically connecting at least one of the electrical leads from the optical sub-assembly to the wiring board; and
   wherein conductive wiring extends from the tab to the second region for electrically connecting one of the electrical leads from the optical sub-assembly to the wiring board.

11. The device according to claim 10, wherein the tab is cut from the second region of the flex cable; and wherein the through opening is an opening in the second region of the flex cable created by separation of the tab from the second region.

12. The device according to claim 10, wherein the second region of the flex cable is disposed adjacent to a lower surface of the wiring board.

13. The device according to claim 10, wherein the wiring board includes a notch therein for receiving the electrical lead connected to the tab.

14. The device according to claim 10, wherein the flex cable includes a plurality of conductive layers separated by at least one insulating layer; and wherein the conductive wiring comprises traces in the conductive layers.

15. An electro-optical device comprising:
   an optical sub-assembly for converting optical signals into electrical signals or for converting electrical signals into optical signals, the optical sub-assembly including electrical leads extending from a rear end thereof;
   a wiring board including electronic circuitry for operating the optical sub-assembly; and
   a flex cable, comprising:
      a conductive wiring, bent to form an angled shape, defining a first region extending parallel to the rear end of the optical sub-assembly, a second region substantially perpendicular to the first region extending parallel to an upper surface of the wiring board, and a bend region therebetween;
      a conductive tab electrically coupled to said conductive wiring coplanar with the first region, extending from the bend region into electrical contact with one of the optical sub-assembly leads; and,
      a through opening in the second region providing access to the conductive tab and the contacted lead.

16. A flex cable according to claim 15, further comprising:
   a first and a second superposed conductive layer, said first conductive layer being comprised of said conductive wiring, and said second conductive layer being comprised of further conductive wirings; and an insulating layer disposed between said first and second conductive layers,
   an insulating coating covering said first and said second conductive layers, said insulating coating having at least one window formed therein to expose a portion of at least one of said conductive wirings, to allow the exposed portion to be electrically coupled to a wiring board, and wherein
   at least one through hole is disposed in said flex cable that passes through said at least one of said conductive wirings, the at least one through hole being adapted to receive a lead of an electrical component therein,
   said at least one through hole is disposed in said conductive tab, and
   said conductive wirings include a ground wiring, said conductive tab having at least a portion of said ground wiring formed therein, said at least one through hole passing through said portion of said ground wiring.

* * * * *